United States Patent [19]

Shimizu

[11] Patent Number: 4,679,306
[45] Date of Patent: Jul. 14, 1987

[54] SELF-ALIGNED PROCESS FOR FORMING DIELECTRICALLY ISOLATING REGIONS FORMED IN SEMICONDUCTOR DEVICE

[75] Inventor: Junzoh Shimizu, Tokyo, Japan

[73] Assignee: NEC Corporation, Japan

[21] Appl. No.: 779,496

[22] Filed: Sep. 24, 1985

[30] Foreign Application Priority Data

Sep. 28, 1984 [JP] Japan ................ 59-203201

[51] Int. Cl.$^4$ ................ H01L 21/385
[52] U.S. Cl. ................ 29/576 W; 29/578; 148/187; 148/188; 156/657
[58] Field of Search ........ 148/187, 188, 175; 29/576 W, 578; 156/657

[56] References Cited

U.S. PATENT DOCUMENTS

| | | | |
|---|---|---|---|
| 3,966,577 | 6/1976 | Hochberg | 29/578 X |
| 4,044,452 | 8/1977 | Abbas | 29/576 W X |
| 4,104,086 | 8/1978 | Bondur et al. | 29/578 X |
| 4,252,582 | 2/1981 | Anantha et al. | 29/576 W X |
| 4,318,751 | 3/1982 | Horng | 29/578 X |
| 4,343,080 | 8/1982 | Hataishi | 29/576 W X |
| 4,376,664 | 3/1983 | Hataishi | 148/175 |
| 4,378,630 | 4/1983 | Horng et al. | 29/576 W X |
| 4,403,392 | 9/1983 | Oshima et al. | 148/188 X |
| 4,445,967 | 5/1984 | Kameyama | 29/576 W X |
| 4,473,940 | 10/1984 | Kiriseko | 29/576 W X |
| 4,497,107 | 2/1985 | Cogan | 148/188 X |
| 4,549,914 | 10/1985 | Oh | 148/188 X |
| 4,551,911 | 11/1985 | Sasaki et al. | 29/576 W |
| 4,569,701 | 2/1986 | Oh | 148/188 |

Primary Examiner—George T. Ozaki
Attorney, Agent, or Firm—Laff, Whitesel, Conte & Saret

[57] ABSTRACT

A process of fabricating a semiconductor device, wherein a semiconductor substrate of one conductivity type has formed therein layers including a semiconductor layer of the opposite conductivity type, an anti-oxidation mask layer, a doped polysilicon layer, an anti-etch mask layer and a silicon oxide film. Within the substrate are defined isolation areas, from which the silicon oxide film, anti-etch mask layer and doped polysilicon layer are selectively etched away. On the resultant structure is formed an undoped or lightly doped polysilicon layer. Then, the structure is heated to cause atoms of the impurity in the doped polysilicon layer to diffuse into the directly adjacent portions of the undoped or lightly doped polysilicon layer. The undoped or lightly doped polysilicon layer is then etched away over its areas on the silicon oxide film and on the device isolation areas of the substrate. The anti-oxidation mask layer is partially etched away. An exposed portion of the semiconductor layer on the substrate, silicon oxide film, and exposed portions of the undoped or lightly doped polysilicon layer are then etched away. The anti-oxidation mask layer is selectively etched away with the anti-etch mask layer being used as a mask. The residual portions of the anti-oxidation mask layer are then used as a mask to form dielectric regions in the isolation areas of the structure.

30 Claims, 20 Drawing Figures

FIG. 6(D)

FIG. 1(A)
PRIOR ART
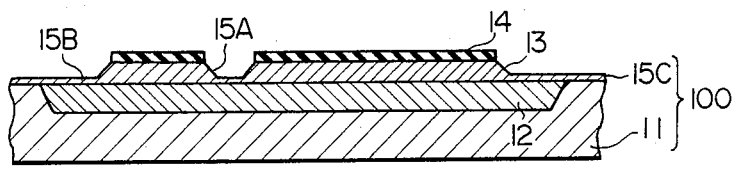
FIG. 1(B)
PRIOR ART
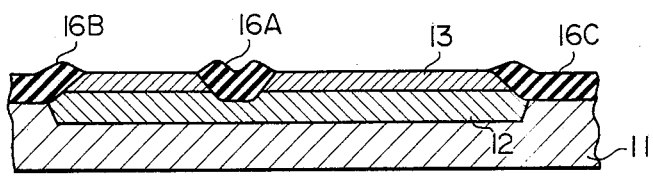
FIG. 2(A)
PRIOR ART
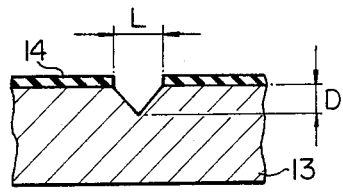
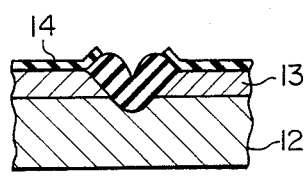
FIG. 2(B)
PRIOR ART

SELF-ALIGNED PROCESS FOR FORMING DIELECTRICALLY ISOLATING REGIONS FORMED IN SEMICONDUCTOR DEVICE

BACKGROUND OF THE INVENTION

The present invention relates to a self-aligned semiconductor fabrication process for fabricating a semiconductor device with dielectrically isolating regions. More specifically, the present invention relaes to a process for forming dielectrically isolating regions having different depths in a semiconductor circuit structure.

Generally, bipolar transistors (which will be called "transistors" hereinafter) fabricated as part of an integrated circuit on a monocrystalline semiconductor substrate, require isolation between the transistors. An isolation technique employing a reverse-biased p-n junction that surrounds an active device area has been used for isolating such transistors from each other. The junction isolation from each other requires a large isolation area and is liable to introduce larger parasitic capacitances than those which ordinarily result from oxide/isolation, a typical example of which is, an isoplanar oxide isolation which is well known in the art. According to this isoplanar oxide isolation technique, a buried collector layer 12 is formed in a silicon body 11, and, then, an epitaxial layer 13 is grown on the silicon body 11 sandwitching the buried collector layer. The silicon body 11, the buried layer 12 and the epitaxial layer 13 constitutes a silicon substrate 100. Using a patterned silicon nitride film 14 as a mask, the epitaxial layer 13 is selectively etched away by alkaline etchant to form groove portions 15A, 15B and 15C as shown in FIG. 1(A). Then, an oxidation process follows. The surfaces of the groove portions are thermally oxidized to obtain isolation oxide 16A, 16B and 16C (See FIG. 1(B)). As a collector contact region is formed between the isolation oxides 16A and 16B, the isolation oxide 16A serves as an base-collector isolation region. On the other hand, the isolation oxides 16B and 16C define an active region where the transistor is fabricated. However, when the width L of each groove is less than square root of the depth D of the groove, the problem is encountered in the conventional technique in that the planarization of the silicon oxide refilled into the etched grooves 16A, 16B and 16C is difficult as shown in FIGS. 2 (A) and 2(B) with a resultant of discrete wiring passing thereon. Further, there is a possibility that the oxidation of the steeply inclined portion of the groove results in occurrrence of crystal defects. For this reason, such a dielectric isolation cannot cover the progress of miniaturization of bipolar transistors.

To overcome this problem, there have been proposed so called trench isolation techniques. For instance, U.S. Pat. No. 3,966,577, U.S. Pat. No. 4,104,086 and U.S. Pat. No. 4,318,751 disclose respective trench type isolation techniques. According to the typical trench type technique, an n+ buried collector layer 32 is formed on the p type body 31, an n− epitaxial layer 33 and a silicon nitride 34 layer being stacked up on the buried collector layer in succession. The silicon body 31, the buried layer 32 and the epitaxial layer 33 constitutes a silicon substate 200. A patterned mask 35 is applied to the silicon nitride layer, then, the silicon nitride layer 34 and the buried collector layer 32 are selectively etched by reactive ion etching technique as shown in FIG. 3(A) so as to form a isolation groove surrounding an active region. After this, the mask 35 is removed. The silicon nitride layer 34 is patterned by etching process using a photoresist 37 as a mask. The epitaxial layer 33 is selectively removed to form a base-collector isolation groove by reactive ion etching technique as shown in FIG. 3(B), the base-collector isolation groove having a depth less than that of the isolation groove surrounding an active region. After the removal of the photoresist 37, the isolation oxides 38 and 39 are thermally grown, thereby refilling the isolation grooves. And if necessary the silicon nitride layer 34 is removed as shown in FIG. 3(C). However, according to the trench technique, a plurality of lithography processes are required to form the isolation grooves in different depth. These successive lithography processes require certain tolerances for mask alignments. These tolerances restrict the enhancement of element density of IC.

As appreciated from the above discussion, when dielectrically isolating regions having at least two different thicknesses are formed in a semiconductor substrate, there exist the following process requirements to be satisfied: First is that miniaturization is possible. Second is that crystal defects are not produced. Third is that good self-alignment nature is insured. Fourth is that the sufface of the isolating region is highly planarized.

SUMMARY OF THE INVENTION

According to one feature of the present invention, there is provided a method of manufacturing a semiconductor device comprising the steps of forming a first mask film on a semiconductor substrate, forming a first polycrystalline silicon layer on the first mask film, the first polycrystalline silicon layer being dropped with p type impurity atoms, forming a second mask film on the first polycrystalline silicon layer, the second mask film being formed of the same material as the first mask film and having a different etching nature from that of polycrystalline silicon, patterning the second mask film and the first polycrystalline silicon layer successively, thereby remaining first and second portions composed of the second mask film and the first polycrystalline silicon layer, forming a second polycrystalline silicon layer on exposed parts of the first mask film and the first and second portions, the second polycrystalline silicon layer being undoped or lightly doped with p type impurity atoms, applying heat treatment to diffuse the p type impurity atoms from the first polycrystalline silicon layer to the second polycrystalline silicon layer, thereby increasing the concentration of the p type impurity atoms in a part of the second polycrystalline silicon layer extending on the first mask film between the first and second portions, selectively removing a portion of the second polycrystalline silicon layer where the p type impurity atoms are not diffused, selectively removing exposed portions of the first mask film, thereby exposing a portion of the semiconductor substrate, selectively removing the exposed portion of the semiconductor substrate, removing the remaining second polycrystalline silicon layer and the first mask film between the first and second portions, thereby exposing a portion of the semiconductor substrate between the first and second portions, and removing the exposed portions of the semiconductor substrate, thereby causing the exposed portions to have different depths from each other. The first and second mask films may be formed of silicon nitride.

According to another feature of the present invention, there is provided a method for forming dielectrically isolating regions utilized in the fabrication of a semiconductor device comprising the steps of: providing a p type semiconductor body; forming a first polycrystalline silicon layer which is heavily doped, on the semiconductor body through a multilayer comprising an n+ buried collector layer, an n− epitaxial layer and a first etching resistive or mask layer stacked in succession; forming a silicon oxide film on the first polycrystalline silicon layer through a second etching resistive mask layer; implementing a selective etch process to remove a portion of the first polycrystalline silicon layer, the second etching resistive layer, and the silicon oxide film, thus, to form first and second spaced apart grooves, the first groove providing for a region for isolation between the adjacent bipolar transistor regions, the second groove providing for a region for isolation between base and collector regions of the bipolar transistor; forming a second polycrystalline silicon layer which is undoped or lightly doped onto the silicon oxide film and the peripheral surfaces of the first and second grooves; applying heat treatment to the second polycrystalline silicon layer, thereby allowing impurity in the first polycrystalline silicon layer to be diffused into the second polycrystalline silicon layer by using the first polycrystalline layer as a diffusion source; implementing a selective etch process to remove the second polycrystalline silicon layer except for the portion of the second polycrystalline silicon layer defining the second groove by alkaline etch solution; implementing an etch process to remove the portion of the first mask layer defining the first groove using the silicon oxide film and the remaining second polycrystalline silicon layer as a mask by hot phosphoric acid or reactive ion etching; after removing the silicon oxide film, implementing an etch process to remove the portion of the n-epitaxial layer and the n+collector layer defining the first groove to an extent of approximately penetrating therethrough; implementing an etch process to remove the second etching resistive mask layer and the first polycrystalline silicon layer, thus allowing the portion of the first mask layer defining the second groove to be removed at the same time; implementing an etch process to remove the portion of the n-epitaxial layer defining the second groove and the portion of the n+ collector layer defining the first groove by using the remaining first mask layer as a mask to such an extent that the first groove is reached to the substrate and the second groove reaches into the n+ collector layer; and refilling the first and second grooves with dielectric material, thus to form dielectrically isolated regions. According to the present invention, there is also provided a method for forming dielectrically isolated regions utilized in the fabrication of a semiconductor device comprising the steps of: providing a p type semiconductor body; forming a first polycrystalline silicon layer which is heavily doped, on the substrate through a multilayer comprising an n+ buried collector layer, an n− epitaxial layer and a first etching resistive or mask layer stacked in succession; forming a silicon oxide film on the first polycrystalline silicon layer through a second etching resistive mask layer; implementing a selective etch process to remove a portion of the first polycrystalline silicon layer, the second etching resistive layer, and the silicon oxide film, thus, to form first and second spaced apart grooves, the first groove providing for a region for isolation between the adjacent bipolar transistor regions, the second groove providing for a region for isolation between base and collector regions of the bipolar transistor; forming a second polycrystalline silicon layer which is undoped or lightly doped, onto the silicon oxide film and the peripheral surfaces of the first and second grooves; applying heat treatment to the second polycrystalline silicon layer, thereby allowing impurity in the first polycrystalline silicon layer to be diffused into the second polycrystalline silicon layer by using the first polycrystalline layer as a diffusion source; implementing a selective etch process to remove the second polycrystalline silicon layer except for the portion of the second polycrystalline silicon layer defining the second groove by alkaline etch solution; implementing an etch process to remove the portion of the first mask layer defining the first groove using the silicon oxide film and the remaining second polycrystalline silicon layer as a mask by hot phosphoric acid or reactive ion etching; after selective removing the silicon oxide film, applying an etch process to the portion of the n-epitaxial layer defining the first groove to remove it to a desired depth by an alkaline etch solution; applying an oxidation process to the etched portion of the n-epitaxial layer defining the first groove under condition of high pressure to refill the first groove with dielectric material, thus, to form one dielectrically isolated region, the portion of the first polycrystalline silicon layer exposed from the second etching resistive mask layer being oxidized at the same time; applying an etch process to the oxidized portion of the first polycrystalline silicon layer, thereafter applying an etch process to the portion of the first mask layer defining the second groove and the etching resistive mask layer to remove them, then implementing an etch process to remove the remaining first polycrystalline silicon layer; and applying an oxidation process to the second groove by using the remaining first mask layer as a mask to refill it with dielectric material, thus to form the other dielectrically isolated region.

BRIEF DESCRIPTION OF THE DRAWINGS

The features and advantages of a self-aligned method for forming dielectrically isolated regions utilized in the fabrication of a semiconductor device according to the present invention will become more apparent from the following description taken in conjunction with the accompanying drawings, in which:

FIG. 1 consists in sections (A) and (B) which are fragmentary cross sectional views showing a conventional isoplanar type isolating method;

FIG. 2 consists in sections (A) and (B) which are fragmentary cross sectional views showing problems of the conventional isoplanar type isolating method;

DETAILED DESCRIPTION OF THE INVENTION

Figure 3A:
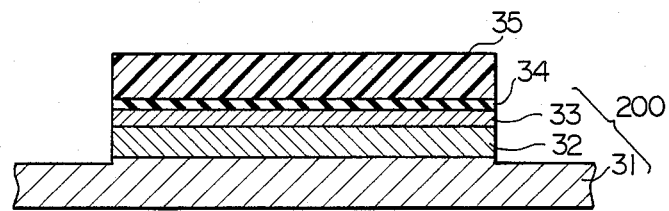
FIG. 3 consists in sections (A) to (C) which are fragmentary cross sectional views showing a conventionl trench type isolating method.
Figure 3B:
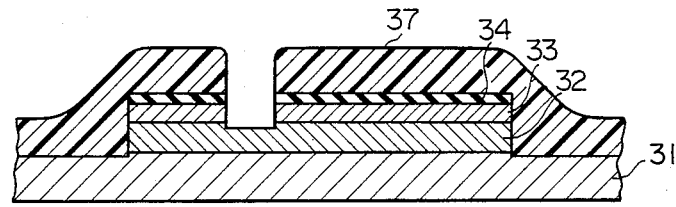
Figure 3C:
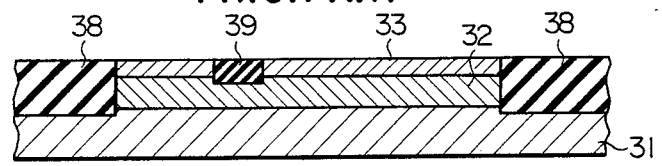

Preferred embodiments according to the present invention will be described with reference to attached drawings.

Sections (A) to (H) of FIG. 4 show fabrication processes for explaining a first embodiment according to the present invention.

As shown in section (A), an n+ buried collector 42 having a sheet resistance 10 to 50 ohms/square and a depth of 1.0 to 2.0 μm is formed on a p type silicon body 41, e.g., having (100) plane to constitute a silicon substrate 300 with the silicon body 41. An n-epitaxial layer 43 having a resistivity of 0.5 to 2.0 ohm-cm and a thickness of 1.0 to 2.0 μm is grown on the n+buried collector layer 42. Then, a protective silicon oxide film (not shown) is grown by oxidation. A multilayer structure comprising a first silicon nitride film 44 as a first noxoxidation and etching resistive mask layer, a heavily boron doped polycrystalline silicon layer 47a, a second silicon nitride film 48 as a second etching resistive layer, and a silicon oxide film 49 is formed by chemical vapor deposition. The first silicon nitride film 44 is 1000 to 2000 Å thick. The polycrystalline silicon layer 47a (1000-2000 Å thick) has a doping concentration of $10^{18}$ to $10^{20}$ atoms/cm$^3$. The second silicon nitride film is 1000 to 2000 Å thick. The silicon oxide film 49 is 1000 to 5000 Å thick with 3000 Å preferred. The silicon oxide film 49 is conducive to enhancing adhesion of a photoresist applied thereto. The silicon oxide film serves as a mask for patterning the second silicon nitride film 48.

As shown in section (B) of FIG. 4, by using a photoresist 46 as a mask, a selective etch process is applied to the silicon oxide film 49, the second silicon nitride film 48, and the heavily boron doped polycrystalline silicon layer 47a by RIE (reactive ion etching). Thus, first and second spaced apart grooves 102 and 104 are formed. The first groove 102 provides for a region for isolation between the adjacent bipolar transistor device regions, whereas the second groove 104 provides for a region for isolation between base and collector regions of the bipolar transistor.

Then, as shown in section (C) of FIG., after the photoresist 46 is stripped off, a second polycrystalline silicon layer 47b which is undoped or lightly doped having a thickness of 1000 to 2000 Å is grown on the silicon dioxide film 49 and the peripheral surfaces of the first and second grooves 102 and 104. The second polycrystalline silicon layer 47b has a doping level less than $10^{17}$ atoms/cm$^3$. Subsequently, heat treatment is applied to the second polycrystalline silicon layer 47b at a temperature of 900° to 1000° C. By using the first heavily boron doped polycrystalline silicon layer 47a as a diffusion source, boron is doped into a part of the second polycrystalline silicon layer 47b. It is here important that boron diffuses into the base-collector contact isolation regions so that it has sufficiently high doping level (more than $10^{18}$ atoms/cm$^3$). It is required that an adjustment of the thickness of the silicon oxide film 49 is made in accordance with width of the base-collector isolation region, thus suppressing a large quantity of boron diffused into the second polycrystalline silicon layer 47b on the silicon nitride film 48.

As shown in section (D) of FIG. 4, a process is conducted to apply selective etching to the second polycrystalline silicon layer 47b to remove it by using an alkaline etch solution e.g. KOH, $N_2N_4$ or $NH_2$ $(CH_2)_2.NH_2$ (etylene diamine), etc. The second polycrystalline silicon layer 47b with high doping level is liable to be etched by the alkaline etchant in comparison with the non or lightly doped second polycrystalline silicon layer 47b based on the difference in hole concentration. This results in removal of the second polycrystalline silicon layer 47b located at the bottom of the groove 102, remaining the second polycrystalline silicon layer 47b located at the bottom of the groove 104.

As shown in section (E) of FIG. 4, using the heavily doped polycrystalline silicon film 47a and the silicon oxide film 49 as a mask, a process is implemented to etch the first silicon nitride film 44 by using hot phosphoric acid or RIE to remove it.

As shown in section (F) of FIG. 4, next step is to etch the protective silicon oxide film (not shown), the n-epitaxial layer 43 and the n+buried collector layer 42 to such an extent that the groove formed by etching substantially penetrates them (depth of 2.0 to 4.0 μm) to remove them. It is desirable to remove particularly the n-epitaxial layer 43 and the n+buried collector 42 by using RIE. Boron diffuses in a side direction in the base-collector contact isolation region because of the above-mentioned heat treatment. It is not removed by the etchant, e.g., KOH or $N_2H_4$, etc. and remains thereat. Accordingly, this remaining portion serves as a mask material at the time when the first silicon nitride film 44 is removed by etching. Thus, this allows the first silicon nitride film 44 in the base-collector contact isolation region to remain while this allows only the first silicon nitride film 44 in the region for isolating active regions to be removed by etching. Further, at the time when the n-epitaxial layer 43 and the n+buried collector layer 42 are removed by etching, the heavily boron doped polycrystalline silicon layer 47a exposed by the second silicon nitride film 48 is also removed at the same time. Accordingly, when the subsequent process is conducted to remove the second silicon nitride film 48 by etching, the base-collector isolation region and the exposed first silicon nitride film 44 located therearound are also removed by etching.

Figure 4A:
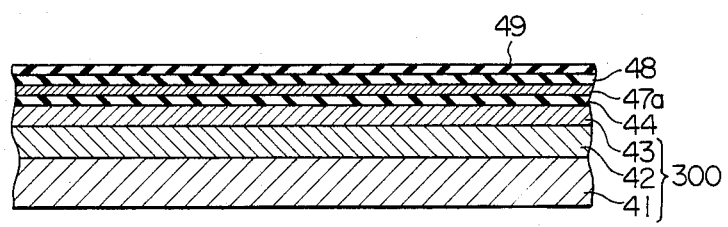
FIG. 4 consists in sections (A) to (H) which are fragmentary cross sectional views showing a first embodiment of the present invention.
Figure 4B:
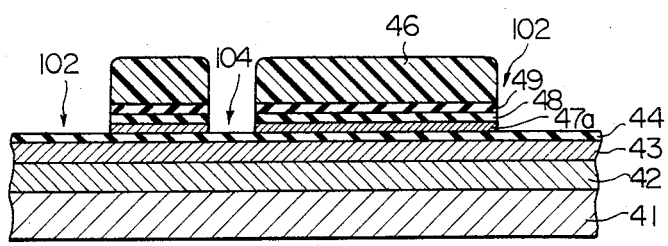
Figure 4C:
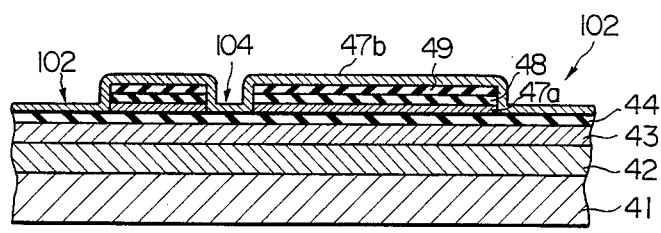
Figure 4D:
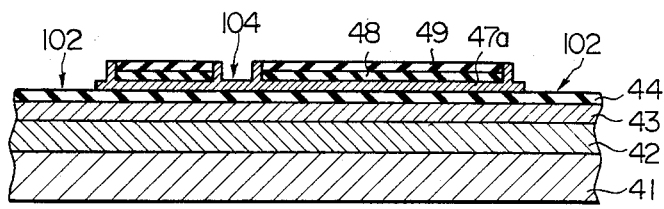
Figure 4E:
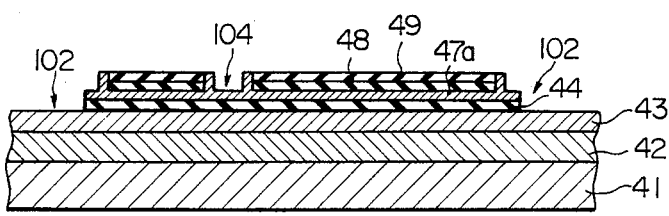
Figure 4F:
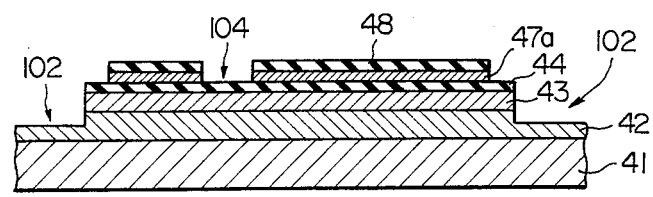
Figure 4G:
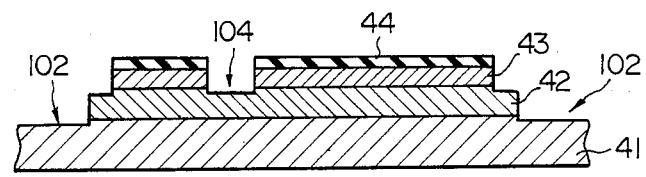

As shown in FIG. 4(G) the next step is to remove the n-epitaxial layer 43 by RIE with the remaining first silicon nitride film 44 as a mask. At this time, the first groove 102 is further removed by etching so that they arrive at the p type silicon substrate 41.

Figure 4H:
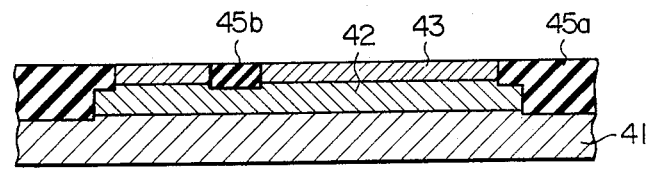

As shown in FIG. 4(H) the next step is to refill the grooves 102 and 104 formed by etching by dielectric material, e.g. LPCVD silicon oxide films 45a and 45b to complete the formation of dielectrically isolated regions.

Then, base and emitter are formed in succession in the base region by a well known technique, to connect respective portions by metal wirings to complete the semiconductor device with the dielectrically isolated regions.

Figure 5:
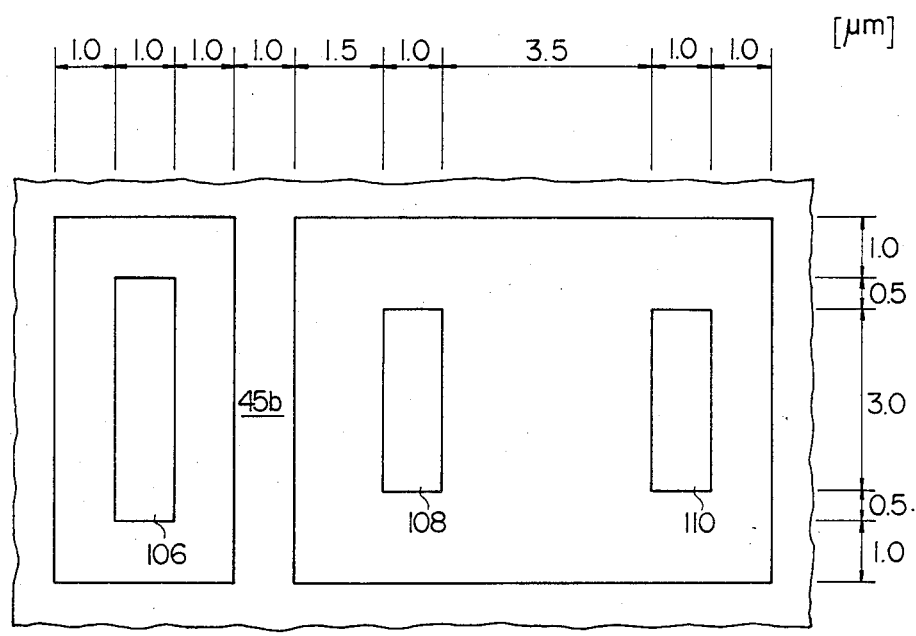
FIG. 5 is a plan view schematically illustrating the region for isolation around base and collector contacts formed by the first embodiment.
Figure 6A:
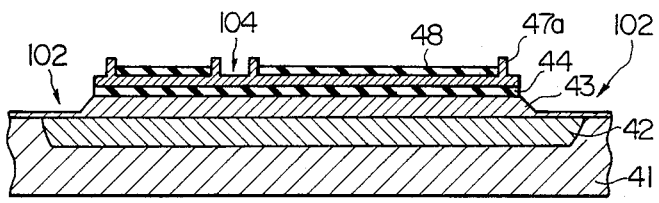
FIG. 6 consists in sections (A) to (D) which are fragmentary cross sectional views showing a second embodiment of the present invention.
Figure 6B:
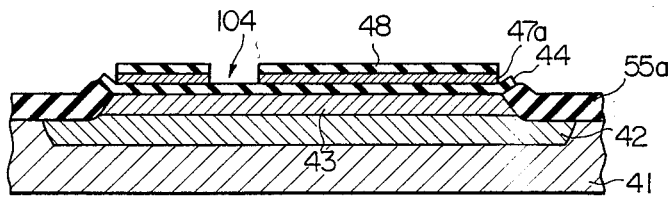
Figure 6C:
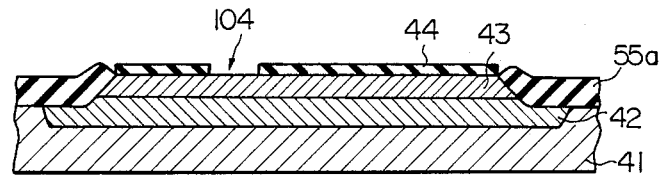
Figure 6D:
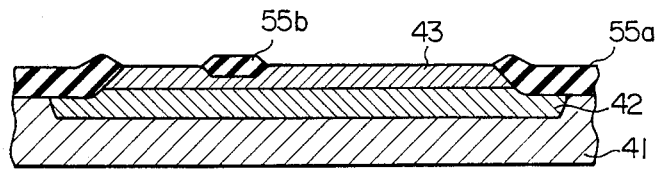

FIG. 5 illustrates the region for isolation between base and collector contact regions (corresponding to the oxide film 45b) having a width of 1 μm wherein reference numerals 106, 108 and 110 denote collector, base and emitter contacts, respectively.

A second preferred embodiment according to the present invention will now be described with reference to FIGS. 6(A) to (D).

In the second embodiment, the present invention is applied to isoplanar type dielectrically isolating method. The dielectrically isolated region in this embodiment can be formed in a manner similar to that in the first embodiment. Because an echant, e.g., KOH or N₂H₄, etc. is used, it is preferable to use a silicon substrate having (100) plane. Except for this, the method in this embodiment includes the same fabrication processes as those shown in FIG. 4(A) to 4(E).

After the process shown in section (E) of FIG. 4, as shown in section (A) of FIG. 6, a process is implemented to remove the protective silicon oxide film (not shown) to etch the n-epitaxial layer 43 to a desired depth by using an etchant, e.g., KOH or N₂H₄, etc.

As shown in section (B) of FIG. 6, the next step is to implement high pressure oxidation to portions to be etched at a temperature of 1000° C. to form a silicon oxide film 55a having a thickness approximately two times larger than the depth of the etching. At this time, portions of the heavily boron doped polycrystalline silicon layer 47a, which are exposed from the second silicon nitride film 48, are oxidized at the same time.

As shown in section (C) of FIG. 6, the next step is conducted to remove the silicon oxide film formed by applying the oxidation process to the heavily boron doped polycrystalline silicon layer 47a by etching, thereafter removing the portion of the first silicon nitride film 44 located within the base-collector isolation region by etching. At this time, the second silicon nitride film 48 is removed at the same time. Subsequently, a process is implemented to remove the remaining heavily boron doped polycrystalline silicon layer 47a. At this time, the base-collector isolation region is not affected by the chemical process by etching because it is coated by a protective silicon oxide film (not shown).

Finally, as shown in section (D) of FIG. 6, an oxidation process is applied to the base-collector contact isolation region by using the remaining first silicon nitride film 44 as a mask to form an oxidation film 55b having a thickness of 5,000 to 10,000 Å. Subsequently, processes similar to those in the prior art are applied to the semiconductor thus configured to form a bipolar transistor.

It is apparent in the above-mentioned first and second embodiment that, after grooves serving as areas for isolating transistor device regions are formed, a p type impurity, e.g., boron, may be injected only into a groove serving as an area for isolating transistor device regions in a self-aligned manner to form a channel stopper.

As described above, the present invention can effectively form at least two dielectrically isolated regions have different thickness in a highly self-aligned fashion by simple fabrication processes, and desirably determine the ratio of dimensions in the thickness and horizontal directions of the dielectrically isolated region, thus providing a miniaturized or superfine and highly integrated structure.

What is claimed is:
1. A method of manufacturing a semiconductor device comprising the steps of:
(a) forming a first mask film on a semiconductor substrate,
(b) forming a first polycrystalline silicon layer on said first mask film, said first polycrystalline silicon layer being doped with p type impurity atoms,
(c) forming a second mask film on said first polycrystalline silicon layer, said second mask film being formed of the same material as said first mask film and having a different etching nature from that of polycrystalline silicon,
(d) patterning said second mask film and said first polycrystalline silicon layer succesively, thereby retaining first and second portions composed of the second mask film and the first polycrystalline silicon layer,
(e) forming a second polycrystalline silicon layer on exposed parts of said first mask film and said first and second portions, said second polycrystalline silicon layer being undoped or lightly doped with p type impurity atoms,
(f) applying heat treatment to diffuse said p type impurity atoms from said first polycrystalline silicon layer to said second polycrystalline silicon layer, thereby increasing the concentration of the p type impurity atoms in a part of the second polycrystalline silicon layer extending on said first mask film between said first and second portions,
(g) selectively removing a portion of said second polycrystalline silicon layer where said p type impurity atoms are not diffused during said step (f),
(h) selectively removing exposed portions of said first mask film, thereby exposing a portion of said semiconductor substrate,
(i) selectively removing part of the exposed portion of said semiconductor substrate,
(j) removing said remaining second polycrystalline silicon layer and said first mask film between said first and second portions, thereby exposing a portion of said semiconductor substrate between the first and second portions, and
(k) removing the exposed portions of said semiconductor substrate, thereby causing the exposed portions to have different depths from each other.

2. A method as set forth in claim 1, wherein said first polycrystalline silicon layer is a heavily boron doped polycrystalline silicon layer having a doping level of $10^{18}$ to $10^{20}$ atoms cm$^{-3}$.

3. A method as set forth in claim 1, wherein said second polycrystalline talline silicon layer is a lightly boron doped polycrystalline silicon layer having a doping level less than $10^{17}$ atoms cm$^{-3}$.

4. A method as set forth in claim 1, wherein said first polycrystalline silicon layer has a thickness of 1000 to 5000 Å.

5. A method as set forth in claim 4, wherein said first polycrystalline silicon layer is preferably 3000 Å thick.

6. A method as set forth in claim 1, wherein said second polycrystalline silicon layer has a thickness of 1000 to 2000 Å.

7. A method as set forth in claim 6, wherein said second polycrystalline silicon layer is preferably 2000 Å thick.

8. A method as set forth in claim 1, wherein said first mask layer is a silicon nitride film having a thickness of 1000 to 2000 Å.

9. A method as set forth in claim 1, wherein, in steps (a), (b) and (c), said first mask layer, said first polycrystalline silicon layer, and said second mask layer are grown by chemical vapor growth method.

10. A method as set forth in claim 1 wherein said etch process recited in step (i) is carried out by reactive ion etching.

11. A method as set forth in claim 1, wherein said etch process recited in step (i) allows the portion of said first polycrystalline silicon layer exposed from said etching resistive layer to be also removed at the same time.

12. A method as set forth in claim 1, wherein after step (l), the method further comprises the steps of forming a base in said base region, forming an emitter in said base, implementing contact wiring of said collector, said base and said emitter to complete the bipolar transistor.

13. A method for forming dielectrically isolated regions utilized in the fabrication of semiconductor device comprising the steps of:
   (a) providing in stacked succession a semiconductor substrate having a p type semiconductor body, an n+buried layer, an n-epitaxial layer and a first mask layer,
   (b) forming a first polycrystalline silicon layer on said substrate, said first polycrystalline silicon being heavily doped,
   (c) forming a silicon oxide film on said first polycrystalline silicon layer through a second mask layer,
   (d) implementing a selective etching process to remove portions of said first polycrystalline silicon layer, said second mask layer, and said silicon oxide film to form first and second spaced apart grooves, said first groove providing an isolation region between the adjacent bipolar transistors said second groove providing an isolation region between base and collector regions of the bipolar transistor,
   (e) forming a second polycrystalline silicon layer which is undoped or lightly doped, over said silicon oxide film and the peripheral surfaces of said first and second grooves,
   (f) applying a heat treatment to said second polycrystalline silicon layer for causing an impurity in said first polycrystalline silicon layer to be diffused into said second polycrystalline silicon layer, said first polycrystalline layer being used as a diffusion source,
   (g) selectively etching with an alkaline etch solution to remove said second polycrystalline silicon layer except for the portion of said second polycrystalline silicon layer defining said second groove,
   (h) selectively etching with a hot phosphoric acid or reactive ion etching to remove the portion of said first mask layer defining said first groove by using said silicon oxide film and said remaining second polycrystalline silicon layer as a mask,
   (i) after removing said silicon oxide film, etching to remove the portion of said n−epitaxial layer and said n+collector layer defining said first groove to an extent of approximately penetrating therethrough,
   (j) etching to remove said second mask layer and said first polycrystalline silicon layer, thus allowing the portion of said first mask layer defining said second groove to be removed at the same time,
   (k) etching to remove the portion of said n-epitaxial layer defining said second groove and the portion of said n+collector layer defining said first groove by using the remaining first mask layer as a mask to such an extent that said first groove reaches into said substrate and said second groove reaches into said n+collector layer, and
   (l) refilling said first and second grooves with dielectric material to form dielectrically isolated regions.

14. A method as set forth in claim 13, wherein said second dielectrically isolated region has a width of 1.0 μm.

15. A method for forming dielectrically isolated regions utilized in the fabrication of a semiconductor device comprising the steps of:
   (a) providing in stacked succession a semiconductor substrate having an n+buried collector layer, an n-epitaxial layer and a first mask layer, said substrate being a p type semiconductor substrate,
   (b) forming on said substrate a first polycrystalline silicon layer which is heavily doped,
   (c) forming a silicon oxide film on said first polycrystalline silicon layer through a second mask layer,
   (d) selectively etching to remove portions of said first polycrystalline silicon layer, said second mask layer, and said silicon oxide film to form first and second spaced apart grooves, said first groove providing an isolation region between adjacent bipolar transistors, said second groove providing for an isolation region between base and collector regions of a bipolar transistor,
   (e) forming a second polycrystalline silicon layer which is undoped or lightly doped, onto said silicon oxide film and the peripheral surfaces of said first and second grooves,
   (f) applying a heat treatment to said second polycrystalline silicon layer for causing an impurity in said first polycrystalline silicon layer to be diffused into said second polycrystalline silicon layer by using said first polycrystalline silicon layer as a diffusion source,
   (g) selectively etching with an alkaline etch solution to remove said second polycrystalline silicon layer except for the portion of said second polycrystalline silicon layer defining said second groove,
   (h) etching with a hot phosphoric acid or reactive ion etching process to remove the portion of said first mask layer defining said first groove by using said silicon oxide film and said remaining second polycrystalline silicon layer as a mask,
   (i) after selectively removing said silicon oxide film, applying an etching process to the portion of said n-epitaxial layer defining sid first groove to remove it to a desired depth by using an alkaline etch solution,
   (j) oxidizing said etched portion of said n-epitaxial layer defining said first groove under a condition of high pressure to refill said first groove with dielectrical material to form one dielectrically isolated region, the portion of said first polycrystalline silicon layer exposed through said second mask layer being oxidized at the same time,
   (k) etching said oxidized portion of said first polycrystalline silicon layer to remove it, thereafter etching the portion of said first mask layer defining said second groove and said second mask layer to remove them, then etching to remove the remaining first polycrystalline silicon layer, and
   (l) oxidizing said second groove by using the remaining first mask layer as a mask to refill it with dielectric material to form the other dielectrically isolated region.

16. A method as set forth in claim 13 or 15, wherein said alkaline etch solution is KOH, N₂H₄ or NH₂(CH₂).NH₂.

17. A method as set forth in claim 13 or 15, wherein said n+buried collector layer has a sheet resistance of 10 to 50 ohms per square and a depth of 1.0 to 2.0 μm.

18. A method as set forth in claim 13 or 15, wherein said n-epitaxial layer has a resistivity of 0.5 ohm cm and a thickness of 1.0 to 2.0 μm.

19. A method as set forth in claim 13 or 15, wherein said silicon oxide film having a thickness of 1000 to 5000 Å.

20. A method as set forth in claim 13 or 15, wherein, in step (b), a protective silicon oxide film is thermally grown on said n-epitaxial layer.

21. A method as set forth in claim 13 or 15, wherein in the diffusion process rectied in (f), the impurity having a doping level greater than $10^{18}$ atoms cm$^{-3}$ is diffused mainly into the portion of said second polycrystalline silicon layer.

22. A method aas set forth in claim 21, wherein an adjustment of the thickness of said insulating layer is made in accordance with the isolation distance of said second groove to suppress excessive diffusion into the portion of the second polycrystalline silicon layer on said etching resistive layer.

23. A method as set forth in claim 13 or 15, wherein the depth removed by said etch process recited in step (i) is 2.0 to 4.0 μm.

24. A method as set forth in claim 13 or 15, wherein said etch process recited in step (i) is carried out by using an alkaline etch solution taken from the group consisting of KOH, $N_2H_4$ and $NH_2(CH_2)NH_2$.

25. A method as set forth in claim 24, wherein after step (i) and prior to step (j), an additional etch process is implemented by using an alkaline etch solution to remove the portion of said first mask layer defining first groove, wherein the portion of said first mask layer defining said second groove remains unaffected by said alkaline etch solution because said impurity is laterally diffused thereinto by said heat treatment recited in step (f).

26. A method as set forth in claim 15, wherein said substrate has a (100) plane.

27. A method as set forth in claim 15, wherein said oxidation process recited in step (j) is carried out at a temperature of 1000° C.

28. A method as set forth in claim 15, wherein a silicon oxide film having a depth approximately two times larger than that obtained by said etch process recited in step (i) is formed by said oxidation process recited in step (j).

29. A method as set forth in claim 15, wherein said etch process recited in step (k) do not affect said second groove because it is covered with a protective silicon oxide film.

30. A method as set forth in claim 13 or 15, wherein after step (k) in claim 2 or (i) in claim 3, a p type impurity is injected into said first groove in a self-aligned fashion to form a channel stopper.

* * * * *